(12) United States Patent
Shih

(10) Patent No.: US 6,604,535 B2
(45) Date of Patent: Aug. 12, 2003

(54) SUBSTRATE CLEANING APPARATUS AND METHOD

(75) Inventor: Yu Lei Shih, Taichung (TW)

(73) Assignee: Applied Materials, Inc., Santa Clara, CA (US)

( * ) Notice: Subject to any disclaimer, the term of this patent is extended or adjusted under 35 U.S.C. 154(b) by 83 days.

(21) Appl. No.: 09/800,156

(22) Filed: Mar. 6, 2001

(65) Prior Publication Data

US 2002/0036004 A1 Mar. 28, 2002

(30) Foreign Application Priority Data

Sep. 28, 2000 (TW) ........................... 89120138 A

(51) Int. Cl.[7] ................................. B08B 3/00
(52) U.S. Cl. .................. 134/95.3; 134/102.1; 134/153; 134/902
(58) Field of Search ............... 134/153, 102.1, 134/902, 95.3

(56) References Cited

U.S. PATENT DOCUMENTS

| | | |
|---|---|---|
| 5,205,051 A | 4/1993 | Hurwitt |
| 5,534,309 A | 7/1996 | Liu |
| 5,829,939 A | 11/1998 | Iwai et al. |
| 5,842,491 A | 12/1998 | Han et al. |
| 5,880,031 A | 3/1999 | Wong |
| 5,885,360 A | 3/1999 | Han et al. |
| 5,887,605 A | 3/1999 | Lee et al. |
| 5,901,716 A | 5/1999 | Hwang et al. |
| 5,964,952 A | 10/1999 | Kunze-Concewitz |
| 6,120,606 A | 9/2000 | Peng |
| 6,129,100 A | 10/2000 | Kitagawa et al. |
| 6,158,445 A | 12/2000 | Olesen et al. |
| 6,197,150 B1 * | 3/2001 | Kwag et al. ............... 134/153 |
| 6,273,108 B1 * | 8/2001 | Bergman et al. .......... 134/102.1 |

* cited by examiner

Primary Examiner—Zeinab El-Arini
(74) Attorney, Agent, or Firm—Janah & Associates

(57) ABSTRACT

A substrate cleaning apparatus includes a chamber having a substrate support capable of supporting and rotating a substrate in the chamber. A cleaning solution injector is provided to inject a cleaning solution onto the substrate in the chamber. A portion of the cleaning solution is thrown off the rotating substrate to form a cleaning solution mist in the chamber. A cleaning gas inlet introduces a cleaning gas into the chamber and an outlet exhausts the cleaning solution mist and cleaning gas from the chamber. This reduces the formation of residues from the cleaning solution mist on the substrate.

15 Claims, 2 Drawing Sheets

ND METHOD

SUBSTRATE CLEANING APPARATUS AND METHOD

BACKGROUND

Embodiments of the present invention relate to the cleaning of a substrate.

In semiconductor processing, a substrate cleaning apparatus is used to clean the substrate as one step of a number of substrate processing steps. In the cleaning step, the substrate should be cleaned throughly, otherwise subsequent processing steps may be affected. A conventional substrate cleaning chamber 10, as illustrated in FIG. 1, comprises a substrate support 20 to support a substrate 50, and an upper nozzle 30a and a lower nozzle 30b, both of which are located at a sidewall of the chamber 10. In operation, as illustrated in FIG. 2, the substrate 50 is placed on the substrate support 20, and the substrate support 20 moves into the proper position. The position of the substrate 50 is between the upper nozzle 30a and lower nozzle 30b. The substrate 50 and the substrate support 20 are rotated, and during rotation, a cleaning solution 27 is injected into the chamber 10 at the substrate 50 from the upper and lower nozzles 30a, 30b. However, because the substrate 50 is rotating rapidly in the chamber 10, centrifugal forces cause the cleaning solution 27 contacting the substrate 50 to be thrown off along a tangential direction to form a cleaning solution mist in the chamber 10. The cleaning solution mist in the chamber 10 can condense on the substrate 50 to form a liquid residue 55 on the substrate surface upon completion of the cleaning process. As illustrated in FIG. 3, after leaving the chamber 10, the liquid residue 55 stains the substrate surface and may include particles and reaction residues. Such residues are undesirable because they can damage the substrate surface or cause subsequent processing steps to fail.

Thus it is desirable to have a substrate cleaning apparatus and process capable of cleaning the substrate without forming liquid residues on the substrate surface.

SUMMARY

A substrate cleaning apparatus comprises a chamber; a substrate support capable of supporting and rotating a substrate in the chamber; a cleaning solution injector capable of injecting a cleaning solution onto the substrate in the chamber, thereby forming a cleaning gas mist in the chamber; a cleaning gas inlet capable of introducing a cleaning gas into the chamber; and an outlet capable of exhausting the cleaning gas and the cleaning gas mist.

A substrate cleaning apparatus comprises a chamber; a substrate support in the chamber, the substrate support capable of supporting a substrate and rotating the substrate in the chamber; an upper cleaning solution injector nozzle, located at a sidewall of the chamber and higher than the substrate, the injector nozzle capable of injecting a cleaning solution into the chamber; a lower cleaning solution injector nozzle, located at the sidewall of the chamber and lower than the substrate, the injector nozzle capable of injecting the cleaning solution into the chamber; a cleaning gas inlet located at a top of the chamber, the cleaning gas inlet capable of introducing a cleaning gas into the chamber; and a plurality of outlets located at the sidewall of the chamber, the cleaning gas outlets capable of exhausting from the chamber, a cleaning solution mist formed from the cleaning solution and the cleaning gas.

A substrate cleaning method comprises rotating a substrate in a chamber, spraying a cleaning solution onto the substrate, thereby forming a cleaning gas mist in the chamber; introducing a cleaning gas into the chamber; and exhausting the cleaning solution mist and cleaning gas from the chamber.

A substrate cleaning apparatus comprises a chamber; a substrate support capable of supporting and rotating a substrate in the chamber; a cleaning solution injector capable of injecting a cleaning solution onto the substrate in the chamber, thereby forming a cleaning gas mist in the chamber; means for introducing a cleaning gas into the chamber; and means for exhausting the cleaning solution mist and cleaning gas from the chamber.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Figure 1:
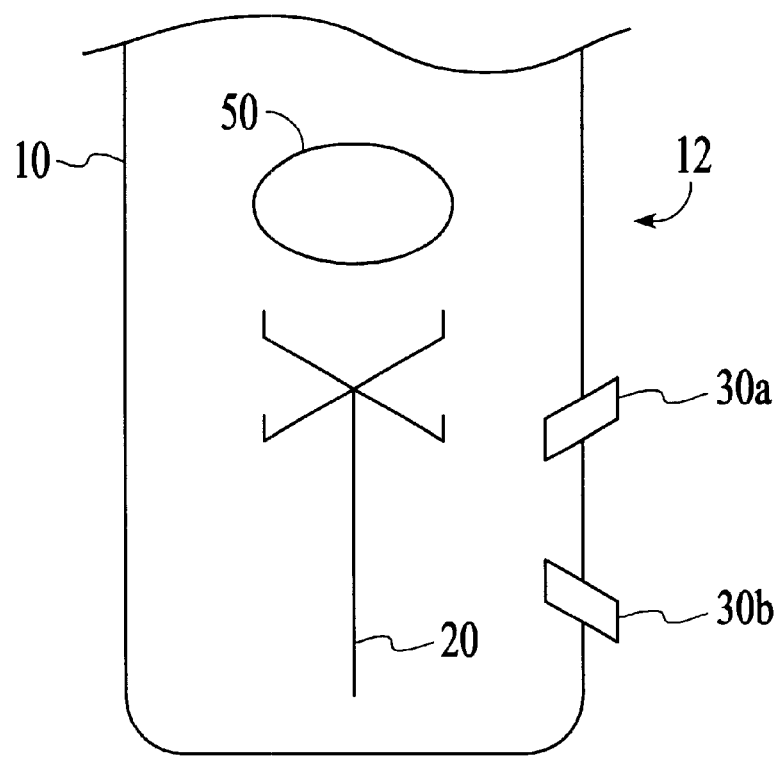
FIG. 1 (prior art) is a schematic view showing a conventional substrate cleaning apparatus.
Figure 2:
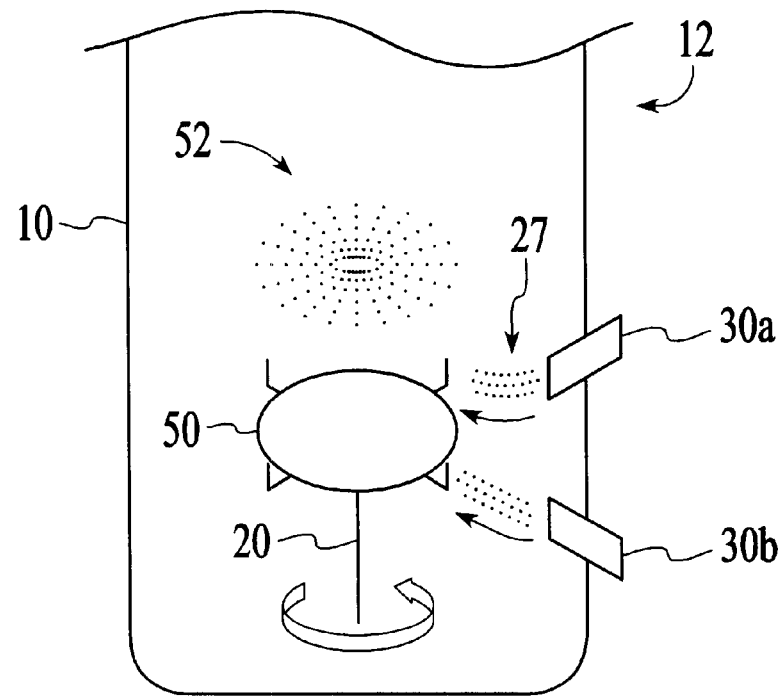
FIG. 2 (prior art) is a schematic view showing operation of the conventional substrate cleaning apparatus in a substrate cleaning process.
Figure 3:
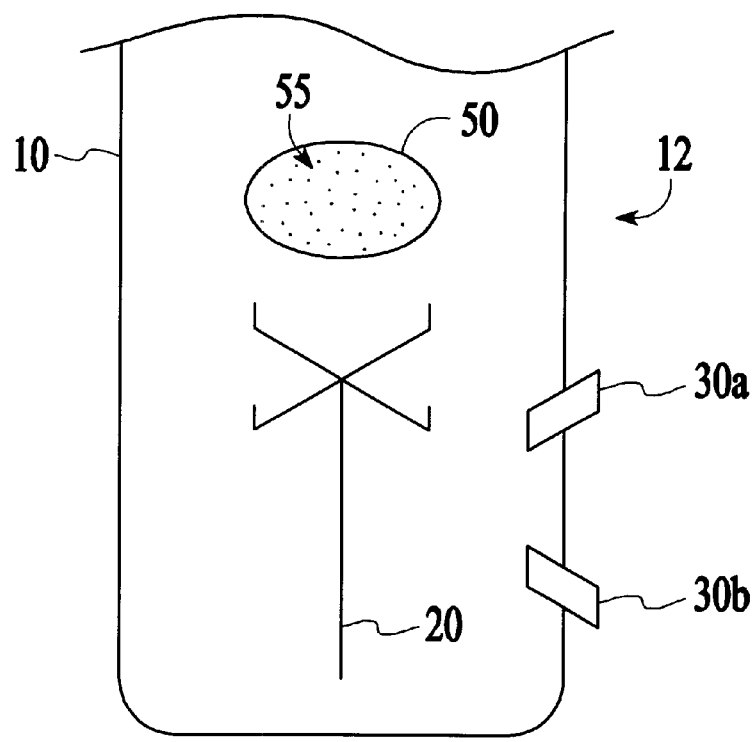
FIG. 3 (prior art) is a schematic view showing the conventional substrate cleaning apparatus after the substrate cleaning process.
Figure 4:
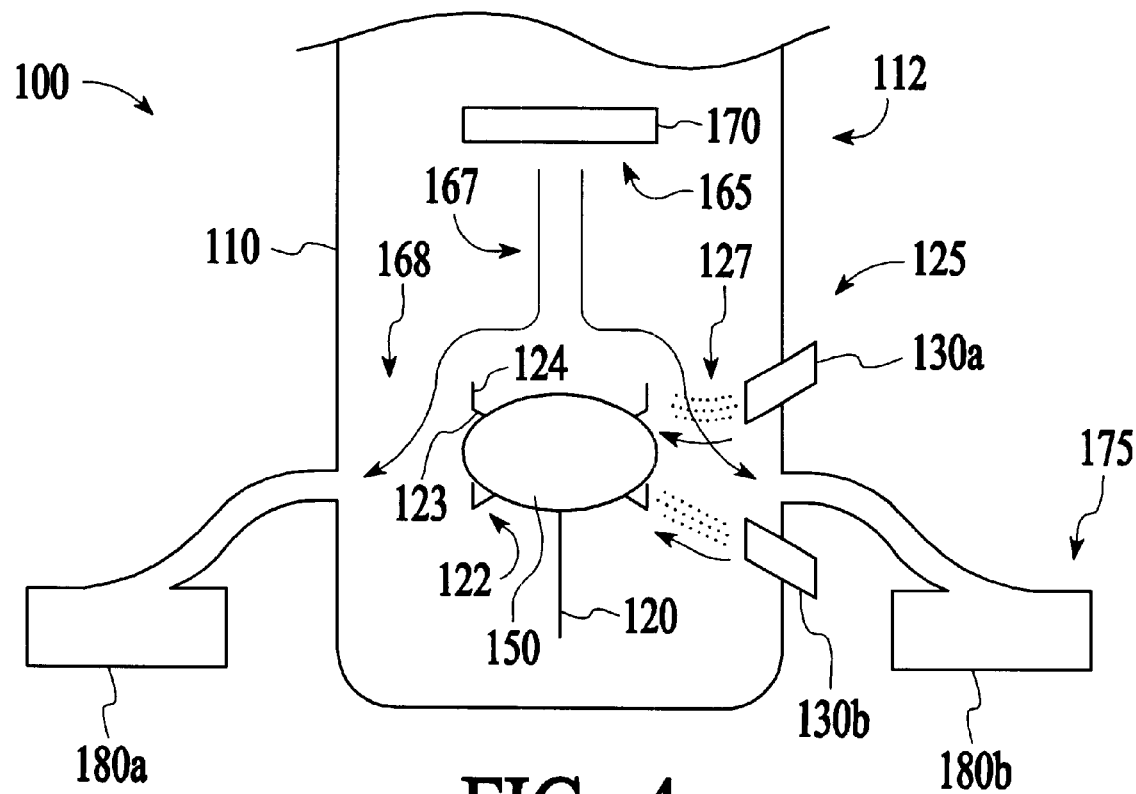
FIG. 4 is a schematic view showing the substrate cleaning apparatus of the present invention.

An embodiment of a substrate cleaning apparatus 100 according to the present invention which is capable of cleaning a substrate 150 is illustrated in FIG. 4. Generally, the substrate cleaning apparatus 100 comprises a chamber 110 that forms a substantially gas-tight enclosure around a substrate support 120. The substrate support 120 is shaped and sized to support a substrate 150 and is capable of rotating the substrate 150. For example, the substrate support 120 may comprise a bracket 122 comprising radially extending arms 123 that are sized slightly larger than the diameter of the substrate 150 and comprising end prongs 124 that serve to hold the substrate 150 in place. A motor (not shown) may be used to rotate the substrate support 120, and consequently, rotate the substrate 150.

The substrate cleaning apparatus 100 further comprises a cleaning solution injector 125 comprising one or more injector nozzles 130a, 130b capable of injecting a cleaning solution 127 onto the substrate 150 in the chamber 110. In an exemplary version, the cleaning solution injector 125 comprises an upper injector nozzle 130a positioned above a lower injector nozzle 130b. This allows cleaning solution to be injected into the chamber 110 from a plurality of different levels in the chamber 110. In one version, the injector nozzles 130a, 130b are located on the sidewall 112 of the chamber 110 and at a height that is about the height of the substrate 150 on the substrate support 120. For example, the nozzle 130a may be positioned slightly above the substrate 150 and the other nozzle 130b may be positioned slightly below the substrate 150, to allow the cleaning solution 127 to be sprayed more uniformly across, and cover, the entire surface of the substrate 150.

The substrate cleaning apparatus 100 further comprises a cleaning gas supply 165 comprising one or more cleaning gas inlets 170 capable of introducing a cleaning gas 167, such as nitrogen, into the chamber 110. The number and arrangement of cleaning gas inlets 170 may depend upon the size of the chamber 110. In an exemplary version, the cleaning gas supply 165 comprises a cleaning gas inlet 170 that is located centrally above the substrate support 120, such as at the top of the chamber 110.

The cleaning gas supply 165 also comprises an exhaust 175 comprising one or more outlets 180*a*, 180*b* capable of exhausting cleaning gas 167 and cleaning solution mist 168 that is formed during the cleaning process. In an exemplary version, the exhaust 175 comprises two outlets 180*a*, 180*b* located about the sidewall 112 of the chamber 110. The outlets 180*a*, 180*b* may be located at the level of, or below, the height of the substrate 150 in the chamber 110.

In operation, after the substrate 150 is placed on the substrate holder 120, the substrate holder 120 moves to the proper position. Then, the substrate holder 120 is rapidly rotated causing synchronous rotation of the substrate 150. The cleaning gas supply 165 introduces cleaning gas 167 into the chamber 110 via the cleaning gas inlet 170. The cleaning solution injector 125 injects the cleaning solution 127 into the chamber 110 and onto the substrate 150. The cleaning solution may be a liquid cleaning solution. The cleaning solution 127 impacts the substrate 150 and at least partially mists to form a cleaning solution mist 168. The cleaning gas outlets 180*a*, 180*b* exhaust the cleaning solution mist 168 and cleaning gas 167 from the chamber 150.

The cleaning gas 167 flows from the cleaning inlet 170 to the cleaning gas outlets 180*a*, 180*b*. The cleaning solution mist 168 also approximately follows the path of the cleaning gas 167 to the cleaning gas outlet 180*a*, 180*b*, as shown in FIG. 4. Therefore, the cleaning solution mist 168 does not remain in the chamber 110, and does not form a liquid residue 55 on the substrate surface after the cleaning process. Thus, the disadvantages associated with forming the liquid residues 55 on the substrate surface in the prior art are reduced.

According to the present invention, a substrate 150 may be optimally cleaned when the total volume of the cleaning gas 167 introduced to the chamber 110 via the cleaning gas inlet 170 is greater than or equal to the total volume of the cleaning solution mist 168 and cleaning gas 167 that is exhausted by the outlets 180*a*, 180*b*. If the total volume of the cleaning gas 167 introduced into the chamber 110 by the cleaning gas inlet 170 is less than the total volume of the cleaning solution mist 168 and cleaning gas 167 exhausted by the outlets 180*a*, 180*b*, air may enter the chamber 110 and contaminate the substrate 150.

Thus, the present substrate cleaning apparatus 100 and method is advantageous because it allows for better substrate cleaning and reduces the formation of liquid residues on the substrate 150.

Although the present invention has been described in considerable detail with regard to certain preferred versions thereof, other versions are possible. For example, the present invention may be used to clean other substrates, such as electronic circuits. The substrate cleaning apparatus may also comprise other equivalent configurations as would be apparent to one of ordinary skill in the art. Thus, the appended claims should not be limited to the description of the preferred versions contained herein.

What is claimed is:

1. A substrate cleaning apparatus comprising:
   a chamber;
   a substrate support capable of supporting and rotating a substrate in the chamber;
   a cleaning solution injector capable of injecting a cleaning solution onto the substrate in the chamber, thereby forming a cleaning solution mist in the chamber, the cleaning solution injector being located at a sidewall of the chamber;
   a cleaning gas inlet capable of introducing a cleaning gas into the chamber, the cleaning gas inlet being located at a top of the chamber; and
   an outlet capable of exhausting the cleaning gas end the cleaning solution mist.

2. The apparatus of claim 1 wherein the cleaning gas inlet is above the substrate.

3. The apparatus of claim 1 wherein the outlet is at the level of or below the substrate.

4. The apparatus of claim 1 wherein the cleaning gas inlet introduces a total volume of the cleaning gas into the chamber that is greater than the total volume of the cleaning solution mist and cleaning gas exhausted by the outlet.

5. The apparatus of claim 1 wherein the cleaning gas inlet introduces a total volume of the cleaning gas into the chamber that is substantially equal to the total volume of the cleaning solution mist and cleaning gas exhausted by the outlet.

6. The apparatus of claim 1 wherein the cleaning gas comprises nitrogen.

7. A substrate cleaning apparatus comprising:
   a chamber;
   a substrate support in the chamber, the substrate support capable of supporting a substrate and rotating the substrate in the chamber;
   an upper cleaning solution injector nozzle, located at a sidewall of the chamber and higher than the substrate the injector nozzle capable of injecting a cleaning solution into the chamber;
   a lower cleaning solution injector nozzle, located at the sidewall of the chamber and lower than the substrate, the injector nozzle capable of injecting the cleaning solution into the chamber;
   a cleaning gas inlet located at a top of the chamber, the cleaning gas inlet capable of introducing a cleaning gas into the chamber; and
   a plurality of outlets located at the sidewall of the chamber, the outlets capable of exhausting from tile chamber, a cleaning solution mist formed from the cleaning solution and the cleaning gas.

8. The apparatus of claim 7 wherein the cleaning gas inlet introduces a total volume of cleaning gas into the chamber that is greater than the total volume of the cleaning solution mist and cleaning gas exhausted by the outlets.

9. The apparatus of claim 7 wherein the cleaning gas inlet introduces a total volume of the cleaning gas into the chamber that is substantially equal to the total volume of the cleaning solution mist and cleaning gas exhausted by the outlets.

10. The apparatus of claim 7 wherein the cleaning gas comprises nitrogen.

11. A substrate cleaning apparatus comprising:
    a chamber;
    a substrate support capable of supporting and rotating a substrate in the chamber;

a cleaning solution injector capable of injecting a cleaning solution onto the substrate in the chamber, thereby forming a cleaning solution mist in the chamber, the cleaning solution injector being located at a sidewall of the chamber;

means for introducing a cleaning gas into the chamber from top of the chamber; and means for exhausting the cleaning solution mist and cleaning gas from the chamber.

12. The apparatus of claim 11 wherein the means for introducing a cleaning gas into the chamber comprises a cleaning gas inlet above the substrate.

13. The apparatus of claim 12 wherein the cleaning gas at introduces a total volume of the cleaning gas into the chamber that is greater than the total volume of the cleaning solution mist and cleaning gas exhausted by the exhausting means.

14. The apparatus of claim 12 wherein the cleaning gas inlet introduces a total volume of the cleaning gas into the chamber that is greater than the total volume of the cleaning solution mist and cleaning gas exhausted by the exhausting means.

15. The apparatus of claim 11 wherein the means for exhausting the cleaning solution mist and cleaning gas from the chamber comprises an outlet at a level that is substantially equal to, or below, the substrate.

* * * * *